United States Patent [19]

Saxena

[11] Patent Number: 5,483,636
[45] Date of Patent: Jan. 9, 1996

[54] AUTOMATED DIAGNOSIS USING WAFER TRACKING DATABASES

[75] Inventor: Sharad Saxena, Richardson, Tex.

[73] Assignee: Texas Instruments Incorporated, Dallas, Tex.

[21] Appl. No.: 415,081

[22] Filed: Mar. 29, 1995

Related U.S. Application Data

[63] Continuation of Ser. No. 12,813, Feb. 3, 1993, abandoned.

[51] Int. Cl.$^6$ .............................. H04J 1/16; G06F 11/34
[52] U.S. Cl. ................... 395/183.01; 395/183.07; 364/249; 364/267.4; 364/267.7; 364/DIG. 1; 365/103; 365/212; 365/208
[58] Field of Search ................... 371/15.1, 13, 29.1, 371/16.5, 21.1, 20.4, 22.1, 22.5, 25.1, 22.6, 40.1; 324/73.1, 158.1; 364/249, 267.4, 267.7, 282.1; 365/103, 114, 174, 212, 208; 395/575; 437/8

[56] References Cited

U.S. PATENT DOCUMENTS

| | | | |
|---|---|---|---|
| 4,618,938 | 10/1986 | Sandland et al. | 364/552 |
| 4,967,337 | 10/1990 | English et al. | 364/184 |
| 4,974,166 | 11/1990 | Maney et al. | 364/478 |
| 5,101,337 | 3/1992 | Ebizuka | 364/184 |
| 5,119,104 | 6/1992 | Heller | 342/450 |
| 5,214,657 | 5/1993 | Farnworth et al. | 371/15.1 |
| 5,262,719 | 11/1993 | Magdo | 371/15.1 |
| 5,315,502 | 5/1994 | Koyama et al. | 364/184 |
| 5,375,229 | 12/1994 | Liccese et al. | 395/575 |

OTHER PUBLICATIONS

Scher, G. M., "Wafer Tracking comes of age", Semiconductor International, May 1991, pp. 126–131.

Scher, G. Eaton, D. H., Fernelius, B. R., Sorenson, J. and Akers, J. W., "In–line stastical process control and feedback for VSLI integrated circuit manufacturing", IEEE Transactions on Components, Hybrids, and Manufacturing, vol. 13, No. 3, Sep. 1990, pp. 484–489.

Patetsky–Shapiro G. and Matheus, C., "Knowledge discovery workbench: an exploratory environment for discovery in business databases", In Proceedings of 1991 AAAI workshop on Knowledge Discovery in Databases, Mar. 1991.

Kaufman, K. A., Michalski, R. S., and Kerschberg, L., "An architecture for integrating machine learning and discovery programs into an data analysis system", In Proceedings of 1991 AAAI workshop on Knowledge Discovery in Databases, Mar. 1991.

*Primary Examiner*—Robert W. Beausoliel, Jr.
*Assistant Examiner*—Dieu-Minh Le
*Attorney, Agent, or Firm*—Jacqueline J. Garner; Richard L. Donaldson; William E. Hiller

[57] ABSTRACT

A system and method for isolating one or more causes of wafer misprocessing. A list of interesting queries (10) is generated. During wafer processing (15), processing parameters are measured (20) and a wafer tracking database (25) is created. The list of queries (10) may be filtered (30) before the queries are tested for interestingness. Interestingness is determined by outlier calculation (35) and trend analysis (40) on data stored in the wafer tracking database (25). Queries found to be interesting are displayed (50).

24 Claims, 5 Drawing Sheets

AUTOMATED DIAGNOSIS USING WAFER TRACKING DATABASES

This application is a Continuation of application Ser. No. 08/012,813, filed Feb. 3, 1993, now abandoned.

FIELD OF THE INVENTION

This invention generally relates to semiconductor processing and more specifically to automated diagnosis of semiconductor misprocessing.

BACKGROUND OF THE INVENTION

The complex interrelationships between different processing steps, and the long sequence of steps that must be performed to produce a functional device, make it difficult to diagnose the causes of misprocessing during semiconductor manufacturing. Often improper processing at one step may cause a step later in the flow to perform inadequately. For instance, non-uniform application of the photoresist in one step may cause a future etching step to etch the wrong portions of the wafer. In addition, the large number of processing steps makes it difficult to isolate the effect of one step on the final product.

The diagnosis task is further complicated due to limited observability. Limited observability refers to the fact that one can measure only a few variables of interest during processing. Most approaches to equipment diagnosis tend to fall into two categories. The first category involves putting additional sensors on individual pieces of the processing equipment to detect specific faults. Providing sensors dedicated to particular equipment and fault type can be quite expensive, and they enable the detection of only a small number of faults. The approach of introducing known faults and obtaining a signature for these faults in specialized test structures can also be classified as belonging to this category of techniques. Here too, only the faults introduced during experimentation can be detected, and one cannot be sure that a new fault is not confounding with the previously introduced faults. The second category of approaches involves constructing models of the operation of the equipment, or the process, and inferring the state of the equipment and/or process by measuring selected output parameters. The use of response surface models and process simulators for diagnosis falls in this category. Model-based approaches do not have a high hardware cost but are limited to diagnosing faults in only those parameters that are comprehended in the models. The accuracy of the models also impacts the effectiveness of these techniques.

Another prior art method, the Wafer Sleuth system, involved the use of wafer tracking information for the isolating the causes of misprocessing. The Wafer Sleuth system employed optical character recognition to read an identifying number, and the location in a carrier, for each wafer as it went through the different processing steps. Later, this information was used to suggest causes of misprocessing. One limitation of the Wafer Sleuth system is that the task of making queries to the wafer tracking database is manual, as is the task of determining whether a query contains information helpful for fault isolation. Since the number of queries that need be examined for fault-isolation can be quite large, this manual process can be quite tedious and time consuming. For instance, suppose that a flow of 100 steps is required to make a device. Furthermore, suppose that the device is considered functional if five parameters are within specified limits. Even if one restricts attention to checking whether all the wafers coming from one machine exhibit values of any parameter different from the wafers coming from other machines, one has to construct and evaluate 500 queries. This can be very tedious, time consuming, and error-prone for a person. Of course, a person may not look at all possible queries, but may only choose to look at those that are most likely to contain fault-isolation information. However, today's VLSI circuits require 200–300 steps, and roughly 100 parameters are checked. Consequently, even an selective search of the space of possible queries can be tedious and time consuming for a person. Moreover, often misprocessing is due to effects that are not obvious, and therefore were not considered likely.

SUMMARY OF THE INVENTION

Generally, and in one form of the invention, a system and method for automatically extracting fault isolation information from a wafer tracking database is disclosed. A wafer tracking database stores a plurality of parameters and a plurality of identifying information associated with each processed wafer. A query generator generates a plurality of queries. Each query is associated with at least one of the plurality of parameters. A query evaluator is used for automated determination of the interestingness of each of the plurality of queries.

Isolating the causes of misprocessing becomes more problematic as integrated circuits become more complex. Accordingly, the invention may be used for automated isolation of the causes of misprocessing in a semiconductor process. As a plurality of wafers are processed, a plurality of process parameters are measured. A wafer tracking database is created which contains the plurality of process parameters and a plurality of identifying information associated with each wafer. A first plurality of queries is generated wherein each query in the first plurality of queries corresponds to at least one of said plurality of process parameters. Each query of the first plurality of queries is applied to said wafer tracking database to obtain a set of observations for each query. Next, the patterns for each query in the first plurality of queries are determined and the first plurality of queries is divided into a second plurality of queries wherein the second plurality contains queries that are considered to have patterns that assist in fault isolation. Finally, the second group of queries is displayed so that the cause of misprocessing can be determined.

An advantage of the invention is automated diagnosis of the causes of wafer misprocessing.

Another advantage of the invention is a less tedious method for isolating causes of wafer misprocessing.

Another advantage of the invention is a less error prone method for isolating causes of wafer misprocessing.

Another advantage of the invention is a less time-consuming method for isolating causes of wafer misprocessing.

Another advantage of the invention is a method for isolating causes of wafer misprocessing which can easily assimilate large volumes of data.

BRIEF DESCRIPTION OF THE DRAWINGS

In the drawings.

Corresponding numerals and symbols in the different figures refer to corresponding parts unless otherwise indicated.

DETAILED DESCRIPTION OF PREFERRED EMBODIMENTS

In semiconductor processing fault isolation has become increasingly complex. Processing parameters must be monitored throughout processing so that when defective wafers are discovered the cause of misprocessing can be determined and corrected. Since today's VLSI circuits require 200–300 steps and approximately 100 parameters to be checked, examining this information can be very tedious, time consuming and error prone. Accordingly, a need has developed for automated fault isolation.

Figure 1:
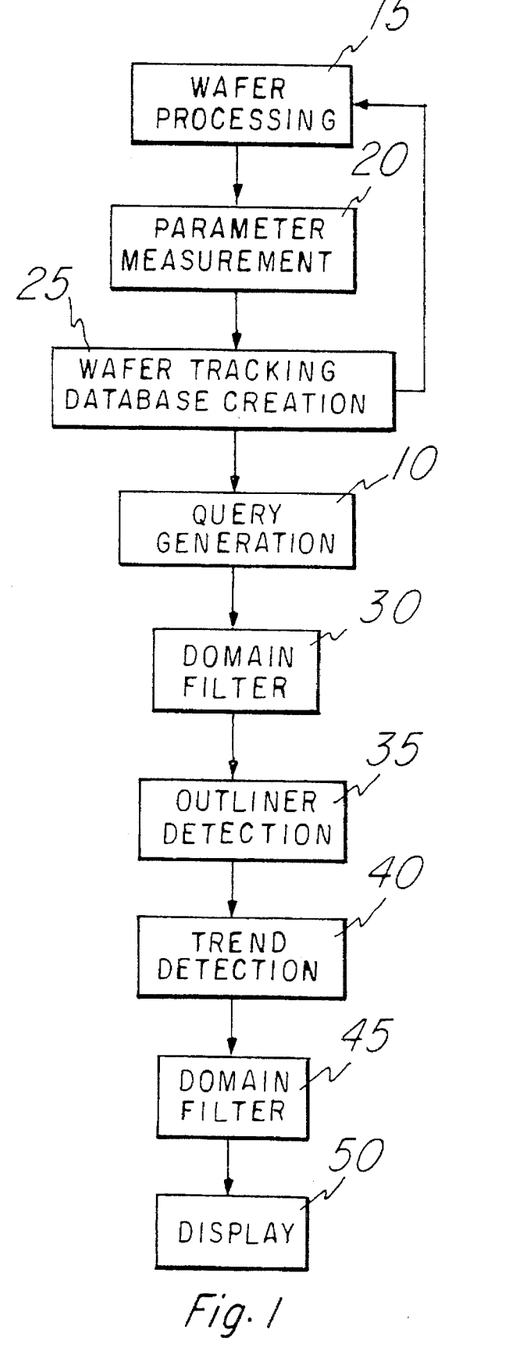
FIG. 1 is a block diagram of an architecture for isolating semiconductor misprocessing according to the invention.
Figure 2:
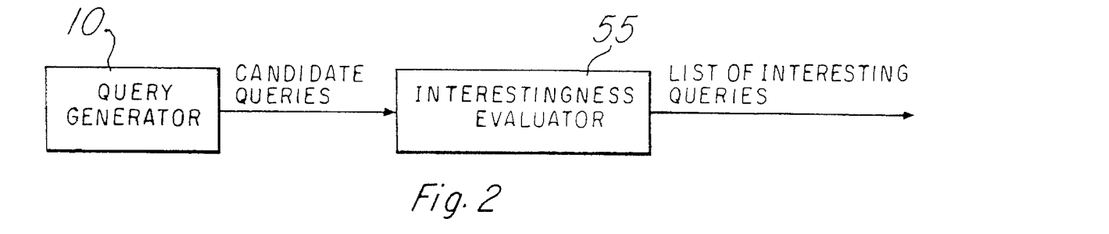
FIG. 2 is a block diagram of an architecture for identifying interesting queries according to the invention.

Automated fault isolation according to the invention will now be described with reference to FIG. 1. As wafers are processed, parameter measurements (20) such as wafer flatness and device size are taken according to well known conventional techniques. A wafer tracking database (25) is created to store tracking information associated with each wafer. Such information will vary depending on the processing step performed on the wafer. For example, in a grinding and polishing step information stored would include such items as serial number, polisher number, head in polisher, time of day, chemical properties of the slurry, defect code, etc. Since the wafer tracking database (25) contains a large volume of data, it would be beneficial to be able to automatically sift through this data and identify queries that are potentially interesting. A query is interesting for the purposes of diagnosis if it can help in the task of fault isolation. The task of identifying interesting queries can be broken into two main components; query generation (10), which generates the set of possible queries; and query evaluation (55), which evaluates the interestingness of each query. FIG. 2 summarizes this overall architecture.

Figure 3:
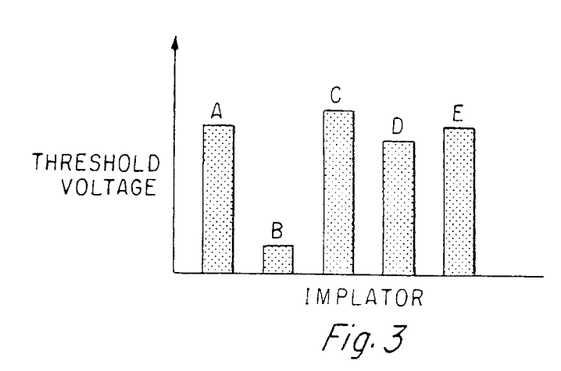
FIG. 3 is a graph showing sample data on which the invention may be practiced (i.e., average threshold voltage versus ion implanter)

The query evaluator (55) determines whether a particular query is interesting. Based on the prior manual use of Wafer Sleuth, one can identify two broad classes of queries that have been useful for fault isolation using wafer tracking information. The first class of queries detects whether a small number of machines and/or wafers in a set behave differently from the rest. For instance, say a fabrication facility has five ion implanters A, B, C, D, and E. Suppose that the average threshold voltage of the wafers processed on these implanters is as shown in FIG. 3. From this figure one concludes that implanter B is producing transistors with much lower threshold voltage than the other implanters, suggesting that implanter B needs repair. Stated differently, FIG. 3 is interesting because one data point is different from the others. Generalizing this observation, data sets containing a small number of outliers have the potential for fault-isolation, and are therefore interesting.

Figure 4:
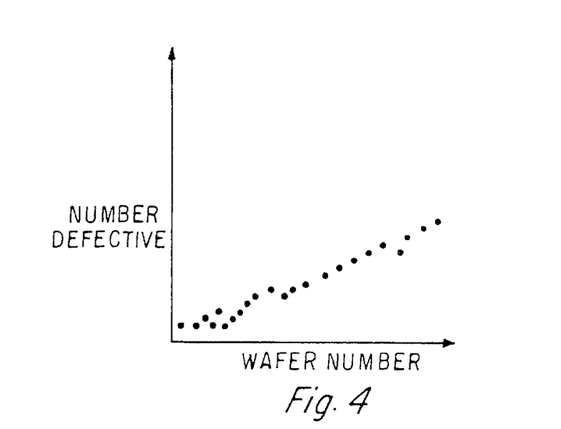
FIG. 4 is another graph showing sample data on which the invention may be practiced (i.e., yield per wafer versus wafer number processed by an etcher)

The second class of queries detect whether there is a trend in the values a certain parameters. Suppose the yield per wafer is plotted versus the wafer number processed by a etcher and the behavior shown in FIG. 4 is observed. If the order in which the wafers are processed on different machines is randomized, and the plot of yield versus wafer number for no other machine shows this trend, then this figure suggests that the etcher may be contributing to yield loss. Generalizing this observation, trends are interesting because of their fault isolation potential.

Detectors for these two queries will be described below. The above two classes of queries are not exhaustive. New classes of queries can be easily added to the library of interestingness detectors. However, in most of the cases where wafer tracking has been successful, the fault isolating query belongs to one of the above two cases.

Based on some domain characteristics, it is often desirable to prune the set of queries considered interesting by the purely data-driven interestingness detectors. For example, if the interestingness detectors can rank the various queries, only those queries that score greater than a given thresholds on the interestingness score need to be investigated. Domain specific filters (45) are provided for additional pruning of queries considered interesting by the interestingness detectors.

Figure 5:
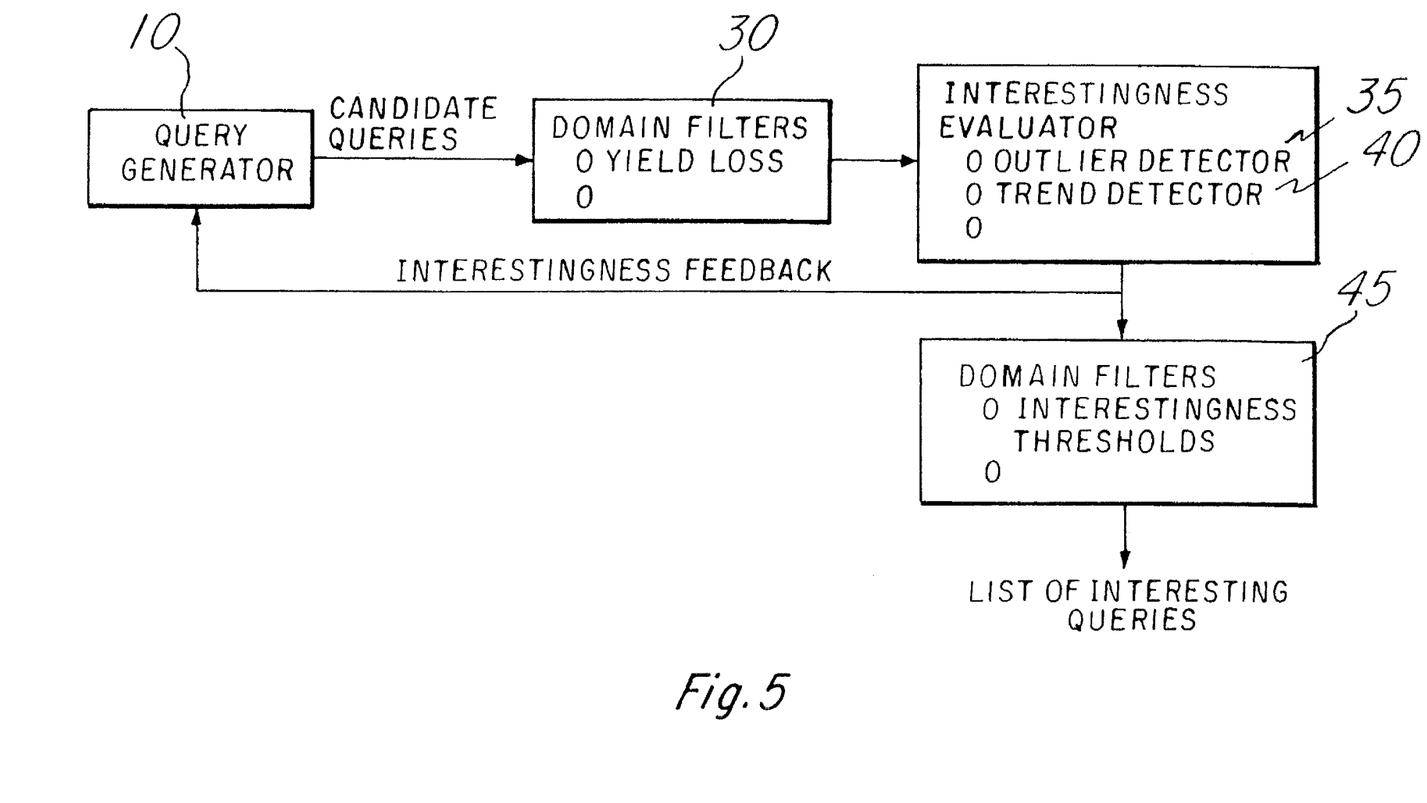
FIG. 5 is a block diagram of an enhanced architecture for identifying interesting queries according to the invention.

The query generator (10) generates candidate queries, which are then evaluated for interestingness. Depending on the available computational resources (especially time), the query generator (10) can be exhaustive, or may incorporate heuristics about queries more likely to be interesting. The query generator (10) can also base the query generation on the feedback obtained from previous queries considered interesting. For instance, if two parameters are known to be related, and the wafers processed together on a particular machine do not exhibit values of one of the parameters different from the values of the wafers produced by the other machines, then the generation of the queries relating to that machine and the second type of parameter can be suspended. The query generator (10) can also have domain filters (30) to prevent generation of queries that are a-priori known to be uninteresting. For example, any queries that result in lower than a given yield loss are removed from consideration. The enhanced architecture incorporating these additions is shown in FIG. 5.

Figure 6:
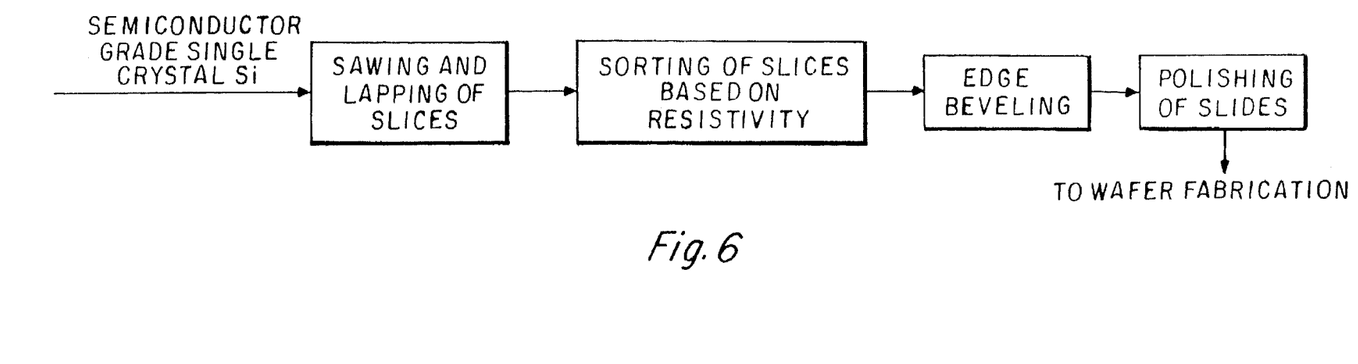
FIG. 6 is a flow diagram of sample process steps in a wafer grinding and polishing facility.

Implementation of the invention in conjunction with a wafer grinding and polishing facility will now be described. It should be understood that the invention is intended for use in any part or all of a manufacturing process not merely the grinding and polishing steps. FIG. 6 shows the steps performed to produce wafers from semiconductor grade single crystal silicon. Typically, the grinding and polishing operations are done on a number of machines and each machine may have a number of heads. The following information is recorded for each wafer as it goes through the grinding and polishing process: serial number, polisher number, head in the polisher, time of day, chemical properties of the slurry, etc. In addition, a wafer is inspected at a number of inspect stations. The defect code, if any, for each wafer is recorded at each station. All this information together constitutes the wafer tracking database (25) for this very small part of the overall process of integrated circuit fabrication. It will be apparent to those skilled in the art the other information may be stored and that the type of information stored will vary depending on the process step and parameter being inspected.

The queries generated by query generator (10) may be exhaustive. For each inspect station and fault code a query may be generated asking for the number of wafers processed by different heads of the different polishers having that fault. For instance, a typical query would be: "Give the number of wafers polished by the head number 3 on polisher A that had defect code 8 during the final inspect."

Next the queries are filtered through a domain filter (30) to remove queries known to be uninteresting. An example of a domain filter (30) is a yield loss filter. All queries for which the total number of wafers having the given defect less than a certain threshold are removed. For instance, if a query was "Give the number of wafers having a defect code 15 at the final inspect" and the total number of wafers having defect code 15 during the final inspect was less than a threshold (i.e., 10 out of 1000 wafers), this query would be filtered and not tested for interestingness.

If a query is not filtered by the domain filters (30), it is tested for interestingness. The result of the query generation process is a list of numbers. Each number represents the number of defective wafers of a particular type produced by the corresponding head and polisher. Two interestingness detectors were implemented; outlier detectors (35) and trend detectors (40).

Implementation of Outlier Detection

An outlier detector (35) may be implemented using a description length profile. A description length profile of a set of observations is a tool for extracting information from databases such as a wafer tracking database (25). The description length profile has the capability for data visualization, data summarization, determination of natural clusters and detection of outliers.

Description Length Profile of a list of integers is a function whose domain is the set of integers that lie between the minimum and maximum of the list. The value of the function for any x in the domain is the number of bits required to describe difference between x and the numbers in the list.

Figure 7:
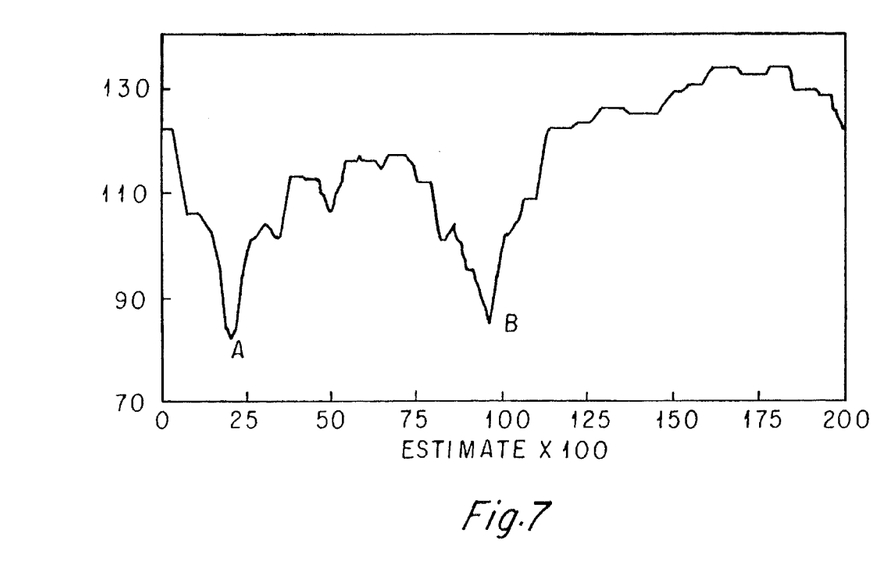
FIG. 7 is a graph showing a description length profile according to the invention.

As an illustration, consider the following list of ten numbers: 19, 20, 22, 21, 50, 90, 95, 97, 96, 200. FIG. 7 shows the description length profile of these numbers. For each number x on the x-axis, the y-value is the number of bits required to describe the difference between x and the ten observations. This profile shows the following:

1. The observations fall into two clusters, one centered around 20 and the other centered around 96. The two deep valleys labeled "A" and "B" indicate the presence of the two clusters. Outliers can be detected by observing the location of each of the ten measurements in profile. Notice that when x=50 and when x=200, the difference between the y-value and the y-value center of either of the two clusters is large. This indicates that 50 and 200 are outliers.

2. Intuitively, this data does not seem to have a single value that can be considered as its central tendency. If 50, 90, 95, 97, 96, and 200 are treated as outliers, then the central tendency is 20. But if 19, 20, 22, 21, and 50 are treated as outliers, the central tendency is 96. However, since 50 is closer to 20 than it is to 96, it lends more support to 20 being the central tendency. This is indicated by a lower value of the minima centered around the point labeled "A". The arithmetic mean of these observation is 70, which is a less intuitive estimate of the central tendencies of the data than the fact that there are two clusters centered around 20 and 96.

If one of the central tendencies is used as a model for the observations, then the observations can be described exactly by describing the central tendency and, for each observation, describing the difference between the observation and the central tendency. To employ this two-part description of the observations a uniquely decodable coding scheme is required so that one can separate the code for the model (here the central tendency) from the codes for the different observations (here the differences). In addition, one should be able to uniquely decode the codes for the different observations. A basic result from information theory says that in order to find the most compact uniquely decodable code, it suffices to look for the most compact prefix code, also called instantaneous code. These are codes in which the codeword for no symbol in the alphabet is a prefix of the codeword for another symbol.

For the purposes of finding central tendencies of a set of numeric observations, the class of models is the set of all real numbers represented with a fixed accuracy. Multiplying all observations with the accuracy converts this to the class of all integers. Assuming one encodes an integer by giving its sign and its magnitude, only a method for coding positive integers is needed. Therefore, in our case, the alphabet is the set of positive integers.

An intuitive property of the central tendency is that it should be close to a large number of observations. Since we will be searching for central tendencies by minimizing description length, this means that further a number is from the central tendency the longer should be the codeword it is assigned. That is, if x is the number denoting the difference between an observation and a hypothesis for a central tendency, and L(x) is the number of bits required to encode a number x, then $L(x)<L(x+1)$. This monotonicity defines the property we would like to have from all models for central tendency.

Our goal now is to find the most compact prefix code for integers that has the above monotonicity property. One such coding scheme is Elias's asymptotically optimal code for positive integers. The idea of this code is to start with a zero and write the binary encoding of the number to be encoded to the left of the zero and thereafter keep writing the binary encoding of the length of the previous group of numbers to the left until the binary encoding of the length becomes zero. Table I gives the algorithm for determining the length of Elias code for a positive integer. To handle the need for encoding zero, x+1 is encoded instead of x.

TABLE I

Codelength Algorithm for Elias' Code length = 1
while ($\lfloor \log(j) \rfloor <> 0$)
   length = length + (1+(log(j))
   j = log(j)
end while
return (length)

A precise definition for computing the description length profile of a list of integers $(y_1, y_2, \ldots, y_n)$ can be now given using the above coding scheme. If the observations are not integers they must be converted to integers by multiplying them with a fixed precision. Let D(x) denote the value of the profile at x, then D(x) is the sum of the number of bits required to describe the absolute value of the difference between x and each of the $y_i$. That is, if $L^*(z)$ denotes the length of the Elias code for z, and |z| denotes the absolute value of z, $$D(x) = \sum_{i=1}^{n} L(|x - y_i|), x \in [\min(y_i), \max(y_i)]$$

In this expression $[\min(y_i), \max(y_i)]$ denotes the closed interval of integers between maximum and maximum of the $y_i$'s.

Notice that though the description of the observations requires describing the central tendency and the deviations from the central tendency, the above equation has no term describing the central tendency. This is because the estimates are encoded with a fixed size code, which is because they just shift the profile uniformly by a fixed amount. The reason for not encoding the estimates also with Elias's code is that one reason for choosing Elias code was its monotonicity property, motivated by the fact that a higher penalty is desired for estimates that are far away from the observations. Coding the estimates with Elias's code would be equivalent to saying that a higher penalty for estimates that have larger absolute values is desired. However, there is no reason to prefer small values, or any values, as estimates.

The properties of the description length profile also admit a purely probabilistic interpretation. To look for central tendency of a set of observations implies that one has a distribution in mind that assigns lower probability to a value the further it is from the central tendency. That is, if x is the difference between a value and the central tendency, then under the assumed probability distribution $P(.)$, $P(x) > P(x+1)$. A common technique of finding central-tendencies assumes a family of distributions with the central tendency as a parameter, and search for the parameter that assigns maximum probability to the observations. This method produces the maximum-likelihood estimates of the central tendency. However, in situations where the family of distributions is not known or cannot be assumed one cannot solve for the maximum-likelihood estimate.

Because Elias's code is an asymptotically optimal, monotonic, prefix code for integers, for any monotonic distribution for integers, as the minimum expected codelength of a prefix code gets larger, the codelength achieved by Elias's code becomes a good approximation of the minimum expected codelength. A basic result from information theory states that the shortest expected value for a prefix code can be achieved if and only if the probability of observing each symbol is known. One can assign to a set of observations x, described with a prefix code of length $L(x)$, a probability $P(x) = 2^{-L(x)}$. Therefore, since $L(x)$ is close to the best possible codelength, the probability assigned to x by Elias's code is a good approximation to the actual probability. Consequently, the estimate that minimizes the codelength is asymptotically a good approximation to the maximum probability of occurrence of the observations; that is, a good approximation of the maximum-likelihood estimate.

Summarizing, outlier detector (35) comprises the following steps:

a. Determine the description length profile for the list of integers according to the formula:

$$D(x) = \sum_{i=1}^{n} L(|x - y_i|), x \in [\min(y_i), \max(y_i)]$$

b. Choose an estimate for the central tendency (c) by choosing the smallest $D(x)$ from the set of $(D(x_1) \ldots D(x_n))$ calculated in step a.

c. Determine the deviation a for each x:

$$\alpha(x_i) = L(|x_i - c|)$$

This results in a set of deviations, $\alpha_1, \alpha_2, \ldots \alpha_n$. The central tendency of these deviations $\hat{\sigma}$ is the deviation of the majority of the values. The central tendency $\hat{\sigma}$ is estimated using the procedure outlined above in steps a and b. Observations that have deviation $\alpha_i$ greater than $\hat{\sigma}$ are considered to be outliers.

Queries are then ranked based on the amount of "outlierness". If $Y_1, \ldots Y_k$ are the points considered as being outliers, and c is the central tendency, then the measure of outlierness is computed as:

$$\text{Interestingness Score} = \sum_{i=1}^{k} 2^{|\frac{Y_i}{1+c}|}$$

Queries with higher values on the measure for outlierness are considered more interesting than queries with a lower value.

Implementation of Trend Detection

Two complications arise when implementing a trend detector (40) to determine whether there is a trend in a point cloud representing a query. First, the trend may not be linear. Consequently, a linear correlation coefficient cannot be used for detecting a trend. This can be handled by using a non-parametric test for a trend. Kendall's $\tau$-coefficient is one such test. M. G. Kendall, "Rank Correlation Methods", (1962). The value of the x-coefficient can be used as a numeric measure of the amount of trend. Queries with higher values of this coefficient are considered more interesting than the queries with a lower value.

The second problem is that a trend may exist only be in a small segment of a point cloud. Collectively, the point cloud may not appear to have a trend based on Kendall's test. If one evaluates a complete point cloud having both increasing and decreasing trends using Kendall's test, the conclusion is that there is no trend. This is because the increasing and the decreasing trends are confounded in one statistic. This problem is handled by systematically considering various subsequences, and evaluating each subsequence for a trend. Table II summarizes this procedure with an example involving five points p1, p2, p3, p4, and p5.

TABLE II

| Systematic consideration of subsequences to detect trends | | | | |
|---|---|---|---|---|
| p5 (p1p2p3p4p5) | p1 (p2p3p4p5) | p1p2 (p3p4p5) | p1p2 p3 (p4p5) | p1p2p3p4 (p5) |
| p4 (p1p2p3p4)p5 | p1 (p2p3p4)p5 | p1p2 (p3p4)p5 | p1p2 p3 (p4)p5 | |
| p3 (p1p2p3)p4p5 | p1 (p2p3)p4p5 | p1p2 (p3)p4p5 | | |
| p2 (p1p2)p3p4p5 | p1 (p2)p3p4p5 | | | |

TABLE II-continued

Systematic consideration of subsequences to detect trends

| p1 | (p1)p2p3p4p5 | | | |
|---|---|---|---|---|
| | p1 p2 | p3 | p4 | p5 |

Only the points within ( ) are checked for a trend. The interestingness score for the query is taken to be the score for the subsequence that has the highest value of the τ-coefficient.

Figure 8:
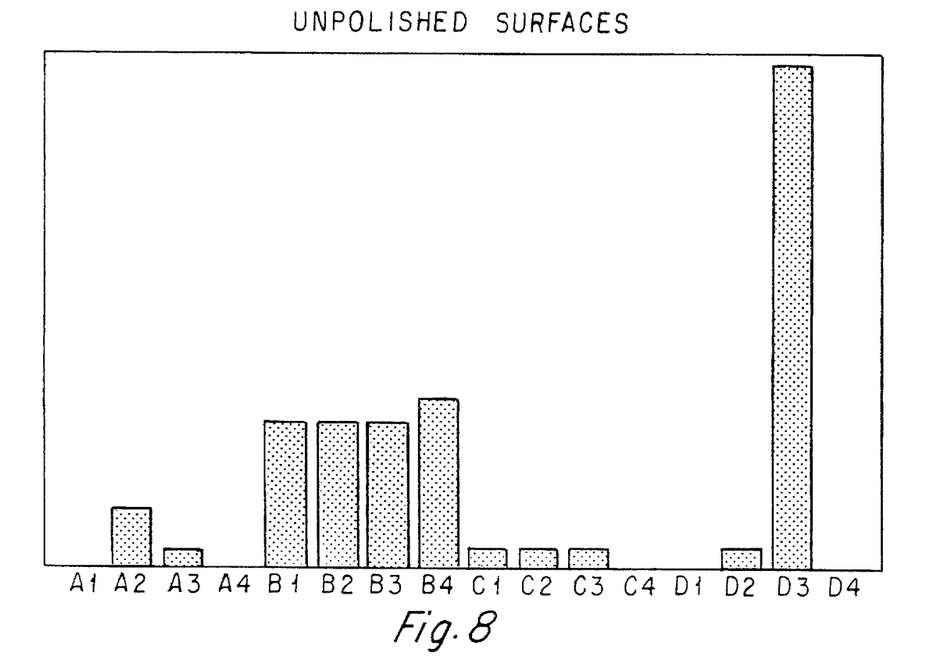
FIG. 8 is a graph of a query found to be interesting according to the invention.

Before display (50) can show the most; interesting queries, a list of interesting queries is sorted in the decreasing order of interestingness score. For example, in the polishing and grinding example, that out of a set of 60 possible queries the system identified 10 queries to be interesting due to the presence of outliers. The 10 queries are ranked in decreasing coder of interestingness score and displayed as shown in Table III. FIG. 8 graphically displays the query considered to be the most interesting due to outliers according to Table III. For each head in a polisher, the plot shows the number of wafers processed by that head that were found at the final inspection to be unpolished. This figure shows that most of the unpolished wafers come from the third head in polisher D; suggesting that the head D3 needs repair. Furthermore, this figure also shows that, excluding the head D3, polisher B is producing more unpolished wafers than other polishers. This suggests that polisher B may need attention soon.

TABLE III

Top ten queries considered as containing outliers

| Number | Inspect Station | Defect | Interestingness Score |
|---|---|---|---|
| 1 | Final | Unpolished Surface | 2083.31 |
| 2 | Final | Haze | 120.00 |
| 3 | Sort | Low Resistivity | 116.00 |
| 4 | Flat | Flatness | 93.88 |
| 5 | Flat | Warp | 59.96 |
| 6 | Sort | Other | 37.74 |
| 7 | Sort | Thin | 37.32 |
| 8 | Final | Dings | 31.71 |
| 9 | Sort | Back Contamination | 22.07 |
| 10 | Final | Polish Scratched | 15.29 |

Figure 9:
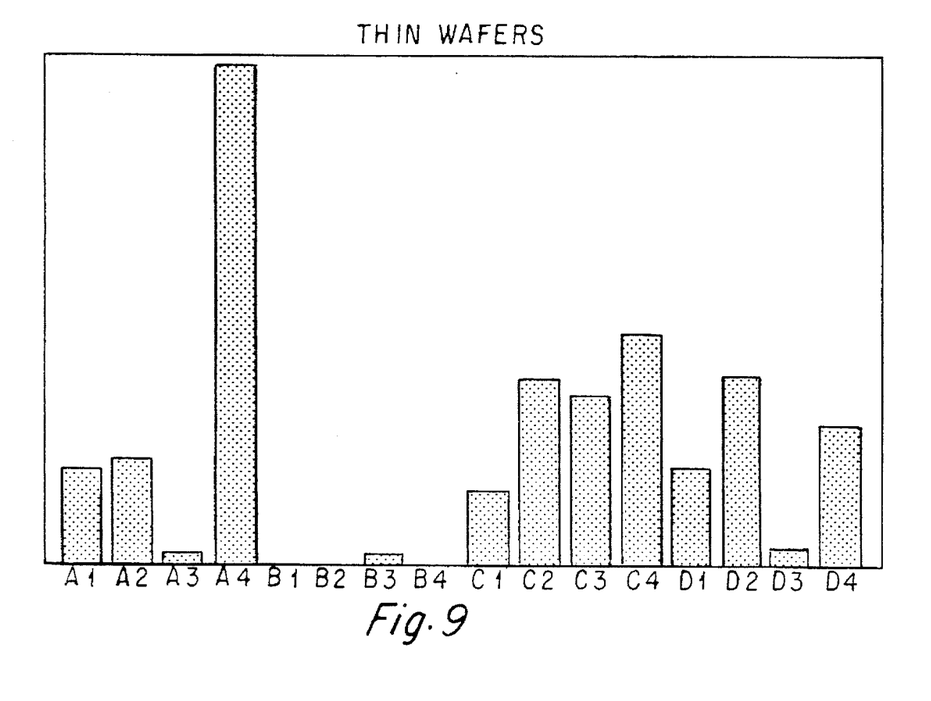
FIG. 9 is a graph of a second query found to be interesting according to the invention.

FIG. 9 shows another query found to be interesting, according to Table III. This figure shows that among the wafers found to be thin at the sorting station a substantially large fraction come from head 4 of polisher A; suggesting that the head A4 needs repair.

Wafer tracking databases (25) represent a rich source of information for attempting diagnosis. Diagnosis from wafer tracking complements other diagnosis techniques because it does not; require special sensors for different kinds of faults, or accurate process and equipment models. By taking a factory level view of the diagnosis task, this technique offers the potential for tying product quality measures to individual pieces of equipment. This is done despite the complex interrelationships which may exist between the various process steps.

Apart from issues concerning diagnosis, the approach presented herein is also relevant to more general questions regarding automated discovery from databases. By implementing some known discovery heuristics that had been found previously to be useful for fault isolation, namely outlier detection (35) and trend detection (40), the task of discovery in this domain was automated. As a general strategy, the task of discovering useful information from databases (25) can be automated by implementing a set of domain-specific interestingness operators and having a method of generating a tractable number of queries which must be checked for interestingness. In fact, for numeric data coming from physical sources domain independent interestingness measures can be contemplated. Projection pursuit attempts this task by considering any non-Gaussian set of points to be interesting. The generate-and-test strategy described in this report is one approach for automating discovery from databases containing information relevant to a specific domain. Such techniques for automated and autonomous analysis of databases are required if the vast quantities of data being recorded today are to become useful information.

A few preferred embodiments have been described in detail hereinabove. It is to be understood that the scope of the invention also comprehends embodiments different from those described, yet within the scope of the claims.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. An automated method for isolating one or more causes of misprocessing in a semiconductor process comprising the steps of:
   a. processing a plurality of wafers;
   b. measuring a plurality of process parameters during said processing for each of said plurality of wafers;
   c. creating a wafer tracking database which contains said plurality of process parameters and a plurality of identifying information associated with each wafer;
   d. generating a first plurality queries wherein each query in said first plurality of queries corresponds to at least one of said plurality of process parameters;
   e. applying each query of said first plurality of queries to said wafer tracking database to obtain a set of observations for each query of said first plurality of queries;
   f. automatically determining from a pattern of each of said set of observations whether each query of said first plurality of queries is interesting for fault isolation;
   g. dividing said first plurality of queries into a second plurality of queries wherein said second plurality contains queries determined to be interesting for fault isolation; and
   h. displaying said second group of queries so that at least one cause of misprocessing can be determined.

2. The method of claim 1 wherein the step for determining whether each query of said first plurality of queries is interesting comprises determining whether each query contains outliers, wherein queries found to contain outliers are interesting.

3. The method of claim 2 wherein, for each query in said first plurality of queries, said step of determining whether each query contains outliers comprises the steps of:

a. converting each of said set of observations associated with the query to an integer so as to create a set of integers $(y_1, y_2, \ldots y_n)$;

b. calculating a first central tendency (c) according to a formula as follows:

$$D(x) = \sum_{i=1}^{n} L(|x - y_i|), x \in [\min(y_i), \max(y_i)],$$

wherein L defined to be Elias's codelength;

and choosing the smallest $D(x)$ as said first central tendency (c);

c. creating a set of deviations by encoding a difference between each integer in the query and said first central tendency according to a formula as follows:

$$\alpha_i = L(|y_i - c|),$$

wherein each encoded difference is a deviation in the set of deviations;

d. calculating a second central tendency from the set of deviations according to a formula as follows:

$$\sigma(z) = \sum_{i=1}^{n} L(|z - \alpha_i|), z \in [\min(\alpha_i), \max(\alpha_i)];$$

and, e. designating the deviations higher than said second central tendency as said outliers.

4. The method of claim 1 wherein the step for determining whether each query of said first plurality of queries is interesting comprises determining whether each query contains trends.

5. The method of claim 4, wherein the step of determining whether each query contains trends comprises the step of:

determining, for each query in said first plurality of queries, whether trends occur in the set of observations associated with said query by dividing the set of observations associated with the query into a plurality of subsets and checking each subset for a trend.

6. A method for isolating one or more causes of semiconductor misprocessing comprising the steps of:

a. creating a wafer tracking database for storing a plurality of process parameters and a plurality of identifying information associated with each wafer;

b. generating a first plurality of queries wherein each query is associated with at least one of said plurality of process parameters;

c. applying said first plurality of queries to said wafer tracking database to obtain a set of observations for each query of said first plurality of queries;

d. filtering said first plurality of queries to create a second plurality of queries having a first predetermined criterion;

e. detecting outliers in the set of observations for each of said second plurality of queries;

f. creating a third plurality of queries containing queries from said second plurality of queries having outliers;

g. detecting trends in the set of observations for each of said second plurality of queries;

h. adding queries from said second plurality of queries having a trend to said third plurality of queries;

i. filtering said third plurality of queries to create a fourth plurality of queries having a second predetermined criterion; and j. listing said fourth plurality of queries.

7. The method of claim 6 wherein, for each query in said second plurality of queries, said step of detecting said outliers comprises the steps of:

a. converting each of said set of observations associated with the query to an integer so as to create a set of integers $(y_1, y_2, \ldots y_n)$;

b. calculating a first central tendency (c) according to a formula as follows:

$$D(x) = \sum_{i=1}^{n} L(|x - y_i|), x \in [\min(y_i), \max(y_i)];$$

and choosing a smallest $D(x)$ as said first central tendency (c);

c. creating a set of deviations by encoding a difference between each integer in the query and said first central tendency according to:

$$\alpha_i = L(|y_i - c|),$$

wherein each encoded difference is a deviation in the set of deviations;

d. calculating a second central tendency from the set of deviations according to the formula:

$$\sigma(z) = \sum_{i=1}^{n} L(|z - \alpha_i|), z \in [\min(\alpha_i), \max(\alpha_i)];$$

and, e. designating the deviations higher than said second central tendency as said outliers.

8. The method of claim 6, wherein the step of detecting trends comprises:

determining, for each query in said second plurality of queries, whether trends occur in the set of observations associated with said query by dividing the set of observations associated with the query into a plurality of subsets and checking each subset for a trend.

9. The system of claim 6, wherein said first predetermined criterion is yield loss.

10. The system of claim 6, wherein said second predetermined criterion is interestingness score.

11. A system for extracting information from a database comprising:

a. a wafer tracking database for storing a plurality of parameters and a plurality of identifying information associated with a plurality of wafers;

b. a query generator for generating a plurality of queries wherein each of said plurality of queries is associated with at least one of said plurality of parameters; and c. a query evaluator connected to said query generator and said wafer tracking database for applying said plurality of queries to said wafer tracking database to determine a set of observations and automatically determining from a pattern in said set of observations whether each of said plurality of queries is interesting for fault isolation.

12. A system for isolating one or more causes of semiconductor misprocessing comprising:

a. a wafer tracking database for storing a plurality of process parameters and a plurality of identifying information associated with a plurality of processed wafers;

b. a query generator connected to said wafer tracking database and operable to generate a first plurality of queries and apply said first plurality of queries to said wafer tracking database to generate a set of observations for each query; and c. an outlier detector connected to the query generator operable to determine whether the set of observations for each of said first plurality of queries contains outliers as determined by the set of observations.

13. The system of claim 12, further comprising a trend detector operable to determine whether said set of observations for each of said first plurality of queries contains trends.

14. The system of claim 12, wherein said outlier detector is operable to create a second plurality of queries, said second plurality of queries containing queries from said first plurality of queries containing outliers.

15. The system of claim 14, further comprising a display for listing said second plurality of queries.

16. The system of claim 13, wherein said trend detector is operable to add queries from said first plurality of queries having a trend at a predetermined significance level to a second plurality of queries.

17. The system of claim 14, further comprising:

a. a first domain filter connected between said query generator and said outlier detector for eliminating queries from said first plurality of queries;

b. a trend detector operable to add queries from said first plurality of queries having a trend at a predetermined significance level to said second plurality of queries;

c. a second domain filter for creating a third plurality of queries from said second plurality of queries; and d. a display for listing said third plurality of queries.

18. The system of claim 12, wherein, for each query in said first plurality of queries, said outlier detector comprises:

a. means for converting each of said set of observations associated with the query to an integer so as to create a set of integers $(y_1, y_2, \ldots y_n)$;

b. means for calculating a first central tendency (c) according to:

$$D(x) = \sum_{i=1}^{n} L(|x - y_i|), x \in [\min(y_i), \max(y_i)];$$

and choosing the smallest $D(x)$ as said first central tendency (c);

c. means for creating a set of deviations by encoding the difference between each integer in the query and said first central tendency according to:

$$\alpha_i = L(|y_i - c|),$$

wherein each encoded difference is a deviation in the set of deviations;

d. means for calculating a second central tendency from the set of deviations according to the formula:

$$\sigma(z) = \sum_{i=1}^{n} L(|z - \alpha_i|), z \in [\min(\alpha_i), \max(\alpha_i)];$$

and, e. means for designating the deviations higher than said second central tendency as said outliers.

19. The system of claim 17, wherein, for each query in said first plurality of queries, said trend detector is operable to perform Kendall's τ-coefficient test on a plurality of subsets of said set of observations associated with the query.

20. A system for isolating one or more causes of semiconductor misprocessing comprising:

a. a wafer tracking database for storing a plurality of process parameters and a plurality of identifying information associated with each of said plurality of process parameters;

b. a query generator connected to said wafer tracking database for generating a first plurality of queries wherein each query is associated with at least one of said plurality of process parameters;

c. a first domain filter connected to said query generator for creating a second plurality of queries from said first plurality of queries based on a first predetermined criterion;

d. an outlier detector connected to said first domain filter operable to create a third plurality of queries containing queries from said second plurality of queries containing outliers;

e. a trend detector connected to said first domain filter operable to add queries from said second plurality of queries having a trend to said third plurality of queries;

f. a second domain filter connected to said trend detector for creating a fourth plurality of queries from said third plurality of queries based on a second predetermined criterion; and, g. a display connected to said second domain filter for listing said fourth plurality of queries.

21. The system of claim 20, wherein said first domain filter is a yield loss filter.

22. The system of claim 20, wherein said second domain filter is an interestingness score filter.

23. The system of claim 20, wherein, for each query in said first plurality of queries, said outlier detector comprises:

a. means for converting each of said set of observations associated with the query to an integer so as to create a set of integers $(y_i, y_2, \ldots y_n)$;

b. means for calculating a first central tendency (c) according to:

$$D(x) = \sum_{i=1}^{n} L(|x - y_i|), x \in [\min(y_i), \max(y_i)];$$

and choosing the smallest $D(x)$ as said first central tendency (c);

c. means for creating a set of deviations by encoding the difference between each integer in the query and said first central tendency according to:

$$\alpha_i = L(|y_i - c|);$$

wherein each encoded difference is a deviation in the set of deviations;

d. means for calculating a second central tendency from the set of deviations according to:

$$\sigma(z) = \sum_{i=1}^{n} L(|z - \alpha_i|), z \in [\min(\alpha_i), \max(\alpha_i)];$$

and, e. means for designating the deviations higher than said second central tendency as said outliers.

24. The system of claim 20, wherein, for each query in said second plurality of queries, said trend detector is operable to perform Kendall's τ-coefficient test on a plurality of subsets of said set of observations associated with the query.

* * * * *